United States Patent
Toshima et al.

(10) Patent No.: US 10,775,456 B2
(45) Date of Patent: Sep. 15, 2020

(54) NMR PROBE

(71) Applicant: JEOL Ltd., Tokyo (JP)

(72) Inventors: Katsuyuki Toshima, Tokyo (JP); Shigenori Tsuji, Tokyo (JP); Shinji Nakamura, Tokyo (JP); Fumio Hobo, Tokyo (JP); Takeshi Tsukada, Tokyo (JP); Akifumi Nomura, Tokyo (JP)

(73) Assignee: JEOL Ltd., Tokyo (JP)

( * ) Notice: Subject to any disclaimer, the term of this patent is extended or adjusted under 35 U.S.C. 154(b) by 21 days.

(21) Appl. No.: 16/392,949

(22) Filed: Apr. 24, 2019

(65) Prior Publication Data

US 2019/0331747 A1   Oct. 31, 2019

(30) Foreign Application Priority Data

Apr. 26, 2018   (JP) .................................. 2018-085705

(51) Int. Cl.
   *G01R 33/385*   (2006.01)
   *G01R 1/067*   (2006.01)
   *G01R 33/421*   (2006.01)

(52) U.S. Cl.
   CPC ..... *G01R 33/3856* (2013.01); *G01R 1/06772* (2013.01); *G01R 33/4215* (2013.01)

(58) Field of Classification Search
   CPC ............ G01R 33/3856; G01R 1/06772; G01R 33/4215; G01R 33/34007; G01R 33/34023; G01R 33/34092; G01R 33/422
   See application file for complete search history.

(56) References Cited

U.S. PATENT DOCUMENTS

| 5,192,911 | A | * | 3/1993 | Hill | ...................... | G01R 33/343 324/322 |
| 5,247,256 | A | | 9/1993 | Marek | | |
| 5,262,727 | A | * | 11/1993 | Behbin | ................. | G01R 33/30 324/318 |
| 5,530,353 | A | * | 6/1996 | Blanz | ..................... | G01R 33/31 324/315 |
| 5,581,186 | A | | 12/1996 | Keller | | |
| 6,008,650 | A | * | 12/1999 | Behbin | ................ | G01R 33/343 324/318 |

(Continued)

OTHER PUBLICATIONS

Extended European Search Report issued in EP19170818.9 dated Sep. 27, 2019.

(Continued)

*Primary Examiner* — G. M. A Hyder
(74) *Attorney, Agent, or Firm* — The Webb Law Firm

(57) ABSTRACT

A sample pipe is provided in a sample temperature control pipe. A detection coil is provided in a low-temperature airtight chamber and configured to irradiate a sample with a high-frequency magnetic field. A room-temperature shield is provided on an outer circumferential surface of the sample temperature control pipe or on an inner circumferential surface thereof, and is configured to block irradiation of the high-frequency magnetic field from the detection coil from reaching a region other than an observation object. A low-temperature shield is provided in an airtight chamber and between the detection coil and the room-temperature shield and is configured to block irradiation of the high-frequency magnetic field from the detection coil from reaching the room-temperature shield.

5 Claims, 9 Drawing Sheets

(56) References Cited

U.S. PATENT DOCUMENTS

| | | | |
|---|---|---|---|
| 6,441,617 B2* | 8/2002 | Marek | G01R 33/30 |
| | | | 324/300 |
| 7,138,802 B2* | 11/2006 | Morita | G01R 33/30 |
| | | | 324/318 |
| 7,701,217 B2 | 4/2010 | Withers et al. | |
| 2004/0113617 A1* | 6/2004 | de Swiet | G01R 33/34069 |
| | | | 324/318 |

OTHER PUBLICATIONS

Anlage, Steven M.; "High Temperature Superconducting Radio Frequency Coils for NMR Spectroscopy and Magnetic Resonance Imaging"; Microwave Superconductivity; 2001; pp. 337-352.

\* cited by examiner

| | ROOM-TEMPERATURE SHIELD WINDOW LENGTH (W3/W1) | Q VALUE | LINE SHAPE (WIDTH AT EACH HEIGHT WITH HEIGHT OF MAIN PEAK DEFINED AS 100%) | |
|---|---|---|---|---|
| | | | 0.55% | 0.11% |
| COMPARATIVE EXAMPLE | NO ROOM-TEMPERATURE SHIELD | 1.00 | 1.0 | 1.0 |
| EXAMPLE 1 | 1.0 | 0.94 | 0.7 | 0.3 |
| EXAMPLE 2 | 1.1 | 0.96 | 0.8 | 0.5 |
| EXAMPLE 3 | 1.2 | 1.00 | 1.1 | 0.7 |

FIG. 5

NMR PROBE

CROSS-REFERENCE TO RELATED APPLICATION

This application claims priority to Japanese Patent Application No. 2018-085705 filed Apr. 26, 2018, the disclosure of which is hereby incorporated by reference in its entirety.

BACKGROUND OF THE INVENTION

Field of the Invention

The present disclosure relates to an NMR probe used in an NMR measurement device.

Description of Related Art

Nuclear magnetic resonance (NMR) devices and electron spin resonance (ESR) devices are known as magnetic resonance measurement devices. Also, magnetic resonance imaging (MRI) devices are known as devices similar to NMR devices. An NMR device will be described below.

NMR is a phenomenon in which atomic nuclei placed in a static magnetic field interact with an electromagnetic wave having a unique frequency. An NMR device utilizes this phenomenon for measurement of a sample at an atomic level. NMR devices are widely used in analysis of organic compounds (e.g., chemicals and pesticides), polymeric materials (e.g., vinyl and polyethylene), biological materials (e.g., nucleic acid and protein), and the like. Using an NMR device, it is possible to elucidate, for example, the molecular structure of a sample.

In an NMR device, an NMR probe (NMR signal detection probe) is provided together with the sample in a superconducting magnet that generates a static magnetic field. The NMR probe includes a detection coil for transmission and reception. The detection coil is configured to apply a high-frequency magnetic field to the sample in transmission and detect an NMR signal of the sample in reception. Since the resonance frequency differs depending on the nuclide to be observed, a high frequency signal having a specific frequency compatible with the nuclide is given to the detection coil during measurement.

In the meantime, homogeneity of the external magnetic field in the sample space is important to improve the detection accuracy of the NMR signal. Presence of an inhomogeneous external magnetic field in the sample space may cause an error in the NMR signal. Magnetization of a component in the vicinity of the sample space is the cause of generation of the inhomogeneous external magnetic field. In particular, a detection coil that detects an NMR signal may cause a disturbed magnetic field in the sample space if its magnetization is finite. In normal cases, an NMR device with a high resolution includes a shimming device that corrects the magnetic field distribution in the sample space. However, the order of the correction is practically limited to a low order and it is difficult to correct an inhomogeneous magnetic field caused by the magnetization of a detection coil having a complex shape. Hence, for a detection coil placed near the sample space and having a complex shape, the magnetization of its material must be made as close to zero as possible.

Also, as a method of detecting the NMR signal, a method using Faraday's law of electromagnetic induction is known. In this method, Johnson noise is the dominant noise. Johnson noise is known to be proportional to the square root of the temperature of the coil and the square root of the electrical resistance of the coil.

A document titled "High Temperature Superconducting Radio Frequency Coils for NMR Spectroscopy and Magnetic Resonance Imaging," Steven M. Anlage, "Microwave Superconductivity," ed. by H. Weinstock and M. Nisenoff, (Kluwer, Amsterdam, 2001), pp. 337-352 discloses a detection coil constituted by a superconductor. Since cooled superconductors have almost zero electrical resistance, superconductors can reduce the above-described noise and improve the detection sensitivity of the NMR signal.

A typical NMR device will be described below with reference to FIG. 1. FIG. 1 illustrates this NMR device 10. The NMR device 10 is a device that measures an NMR signal generated by nuclei observed in a sample.

A static magnetic field generation device 12 is a device that generates a static magnetic field. A bore 14 is formed at the center of the static magnetic field generation device 12. The bore 14 is a cavity extending in the vertical direction. A NMR probe 16 basically includes an insertion section 18 and a base section 20. The insertion section 18 as a whole has a vertically stretched cylindrical shape and is inserted into the bore 14 of the static magnetic field generation device 12.

A detection circuit 22 is provided in a probe head in the insertion section 18. The detection circuit 22 is a tuning/matching circuit. The detection circuit 22 includes a detection coil 24 for detecting an NMR signal, a transmission and reception coupling coil 26, and other electronic components such as a tuning variable capacitor and a matching variable capacitor. The coupling coil 26 is also referred to as pickup coil or transmitting/receiving coil. The coupling coil 26 generates a fluctuating magnetic field in the irradiation period (transmission period) and receives the NMR signal detected by the detection coil 24 in the observation period (reception period). Characteristics of the detection circuit 22 are optimized by changing the setting values (capacitances) of the tuning variable capacitor and the matching variable capacitor. In other words, tuning and matching are thereby achieved. It should be noted that it may be the case that the coupling coil 26 is not used and transmission and reception by the detection coil 24 is performed by wire connection.

A transmission unit 30 of a spectrometer 28, which includes a signal generator and a power amplifier, generates and outputs a transmission signal. In the NMR measurement mode, the natural frequency of the observation-target nuclide is set as the frequency of the transmission signal. The transmission signal that has been output from the transmission unit 30 is sent to the detection circuit 22 in the NMR probe 16 via a duplexer 32, which is a transmit/receive switch. It should be noted that the duplexer 32 may be located within the NMR probe 16.

The NMR signal (received signal) that has been detected by the detection coil 24 is sent to a reception unit 34 of the spectrometer 28 via the duplexer 32. The reception unit 34 has a known circuit configuration that includes a quadrature detection circuit, an analog-to-digital converter, etc., and performs predetermined processing on the received signal. The received signal that has been processed by the reception unit 34 is sent to a spectrum processing unit 36. The spectrum processing unit 36 carries out fast Fourier transform (FFT) processing on the received signal to generate a spectrum (NMR spectrum) or carries out necessary analysis or the like on the received signal. The results of the processing by the spectrum processing unit 36 are indicated on a not-shown display unit. Also, the spectrometer 28 includes an input section used to perform setting on the measurement-target nuclide and the like. It should be noted that the spectrum processing unit 36 may be configured by a computer.

A cooling system 38 may include a refrigerator. The cooling system 38 is a system that supplies helium gas that has been cooled by the refrigerator to the NMR probe 16 and thereby cools the components to be cooled in the NMR probe 16. For example, the components to be cooled may be cooled to 20K or less.

The sample chamber and the detection coil will be described below with reference to FIG. 2. FIG. 2 is a perspective view illustrating the sample chamber and the like. A sample temperature control pipe (VT pipe) 40 is provided in the insertion section 18 of the NMR probe 16. The sample temperature control pipe 40 may be a glass pipe. The sample temperature control pipe 40 is provided so as to extend through a stage 42 and a probe cap 44. A sample pipe 46 (sample container) is provided in the sample temperature control pipe 40 so as to accommodate the sample. The insertion section 18 is provided in the bore 14 of the static magnetic field generation device 12 such that the sample and the center of the sample pipe 46 coincide with the center of a static magnetic field $H_0$. The inside of the sample temperature control pipe 40 is an atmospheric space and the sample is placed in the atmospheric space. A temperature control gas (VT gas) for adjusting the temperature of the sample is supplied to the inside of the sample temperature control pipe 40 and the temperature of the sample is controlled by the temperature control gas. For example, the temperature in the sample temperature control pipe 40 is maintained at room temperature and the temperature of the sample is maintained at room temperature.

An airtight chamber 48 is formed between the sample temperature control pipe 40 and the outer wall of the insertion section 18. The airtight chamber 48 is depressurized to vacuum state. The detection circuit 22 (detection coils 24A, 24B serving as the detection coil 24, the coupling coil 26, a tuning variable capacitor, and a matching variable capacitor) is provided in the vacuum depressurized airtight chamber 48. In the example illustrated in FIG. 2, the detection coil 24A is a flat coil and is a detection circuit pattern (electric circuit pattern) of a thin film formed on a substrate 50A. Although not shown, the detection coil 24B is also a flat coil and is a detection circuit pattern of a thin film formed on a substrate 50B. The detection coils 24A and 24B are composed of superconductors. As a superconductor, a type-II superconductor may be used, for example. The detection coils 24A, 24B are used as a pair of detection coils. The substrates 50A, 50B may be, for example, sapphire substrates. The substrates 50A, 50B are provided on opposite sides of the sample and the sample temperature control pipe 40. The substrates 50A, 50B are held by a detection coil tool such that the detection coils 24A, 24B are substantially parallel to the static magnetic field $H_0$ created by the static magnetic field generation device 12.

The detection coil 24A is formed as a coil pattern on the substrate 50A and includes an element of an inductance L and an element of a capacitance C. Although not shown, the detection coil 24B likewise includes an inductance L and a capacitance C. By adopting this configuration, an LC resonant circuit is configured.

In the above-described configuration, the detection circuit 22, which corresponds to a component to be cooled, is cooled to a very low temperature. In order to improve the signal-to-noise (S/N) ratio of the signal, the variable capacitor is cooled along with the detection coils 24A, 24B and the coupling coil 26. As a cooling mechanism, for example, a cooling system (cryostat cooling system) disclosed in JP 2014-41103A may be used. Specifically, cooled helium gas is introduced from the cooling system 38 into a heat exchanger 52 connected to the stage 42 and the heat exchanger 52 is cooled to a very low temperature (e.g., 20K or less). As a result, the component to be cooled is cooled. When the detection coils 24A, 24B are cooled, the electrical resistance of the detection coils 24A, 24B decreases, as a result of which the detection sensitivity at the time of NMR measurement is improved. It should be noted that a not-shown temperature sensor is attached to the NMR probe 16 and the temperatures of the component to be cooled and the like are sensed by the temperature sensor.

In the meantime, it is generally preferable that distribution of the high-frequency magnetic field becomes homogeneous on the observation object and becomes zero in the space other than the observation object. In the NMR devices disclosed in U.S. Pat. Nos. 5,192,911 and 7,701,217 B, a shield for covering the sample is used to prevent irradiation of high-frequency magnetic field from reaching the regions other than the observation object.

A shield according to a traditional technique will be described below with reference to FIG. 3. FIG. 3 is a sectional view illustrating an NMR probe according to a prior-art technique. The sample temperature control pipe 40 has a cylindrical shape and the sample pipe 46 is provided in the sample temperature control pipe 40. A space 54 in the sample temperature control pipe 40 is an atmospheric space and the temperature in the space 54 is controlled by temperature control gas supplied into the sample temperature control pipe 40. A sample is provided in the sample pipe 46. The airtight chamber 48 which is depressurized to a vacuum state is formed around the sample temperature control pipe 40. A detection coil 56 which as a whole has a cylindrical shape is provided in the airtight chamber 48. The detection coil 56 may be a saddle coil made of metal. The detection coil 56 is provided so as to surround the sample temperature control pipe 40 in a state where the detection coil 56 is not in contact with the sample temperature control pipe 40. Also, two rectangular window sections 58 are formed and positioned in the detection coil 56 so as to face each other. A high-frequency magnetic field is created in a direction perpendicular to the window sections 58. Also, a low-temperature shield 60 which as a whole has a cylindrical shape is provided between the sample temperature control pipe 40 and the detection coil 56 in the airtight chamber 48. The low-temperature shield 60 is provided so as to surround the sample temperature control pipe 40 in a state where it is not in contact with the sample temperature control pipe 40. The low-temperature shield 60 serves as a shield against the high-frequency magnetic field. The low-temperature shield 60 includes a window section 62 formed at least at a location corresponding to the window section 58 of the detection coil 56. The high-frequency magnetic field generated at the detection coil 56 passes through the window section 62 of the low-temperature shield 60 such that a predetermined range of the sample (observation object 64) is irradiated therewith. In this manner, the low-temperature shield 60 is configured to restrict the range of the sample to be irradiated with the high-frequency magnetic field such that only an observation object 64 of the sample is irradiated with the high-frequency magnetic field. The detection coil 56 and the low-temperature shield 60 are provided in the airtight chamber 48 and cooled to a very low temperature by the heat exchanger 52 which is not shown in FIG. 3. The temperature control gas is supplied into the sample temperature control pipe 40 and the temperature of the sample is controlled by the temperature control gas.

In the meantime, even when the range of irradiation of the high-frequency magnetic field is restricted by the low-temperature shield 60, the high-frequency magnetic field that has been generated by the detection coil 56 evasively reaches the back side of the low-temperature shield 60 by the diffraction by the window section 62 of the low-temperature shield 60 as indicated by an arrow 66 in FIG. 3 and the sample is irradiated with the high-frequency magnetic field with the spread. As a result, a region 68 on the outer side of the observation object 64 will also be irradiated with the high-frequency magnetic field. In other words, since the low-temperature shield 60 is provided away from the sample pipe 46, a space is created between the low-temperature shield 60 and the sample pipe 46, as a result of which the sample is irradiated with the diffracted high-frequency magnetic field with a spread. Although the diffracted high-frequency magnetic field is attenuated as compared with the high-frequency magnetic field with which the observation object 64 is irradiated, the diffracted high-frequency magnetic field gives the spread to the NMR waveform and causes reduction in the resolution of the NMR spectrum. Since a longer distance between the low-temperature shield 60 and the sample pipe 46 leads to a larger degree of the spread of the diffracted high-frequency magnetic field, the degree of the reduction in the resolution of the NMR spectrum also becomes larger.

In order to reduce the degree of spread of the diffracted high-frequency magnetic field, a possible approach is to arrange a shield at a location closer to the sample pipe 46 (e.g., on the sample temperature control pipe 40). However, if the shield is provided on the sample temperature control pipe 40, the temperature of the shield rises due to the heat from the temperature control gas and the resistance of the shield is increased. When the shield in such a state is irradiated with the high-frequency magnetic field from the detection coil 56, contribution of absorption of the high-frequency magnetic field becomes larger than that of reflection thereof in this shield, as a result of which the Q value of the detection coil 56 decreases, causing loss in the high-frequency magnetic field. In order to ensure that the shield is not affected by the heat from the temperature control gas, a possible approach is to arrange the shield away from the sample temperature control pipe 40 and form a vacuum insulation layer between the shield and the sample temperature control pipe 40 as illustrated in FIG. 3. In this case, however, the degree of spread of the diffracted high-frequency magnetic field at the window section 62 is increased and wider portions other than the observation object will be irradiated with the high-frequency magnetic field.

SUMMARY OF THE INVENTION

An object of the present disclosure is to suppress irradiation of a high-frequency magnetic field to the portion or portions other than the observation object and suppress high-frequency loss in an NMR probe.

An aspect of the present disclosure provides a nuclear magnetic resonance (NMR) probe inserted into an NMR device and detecting an NMR signal from a sample. The NMR probe includes a detection coil, a first shield, and a second shield. The detection coil is provided in a low-temperature region so as to surround a sample container accommodating the sample. The temperature of the low-temperature region is lower than a temperature of the sample. The detection coil is configured to irradiate the sample with a high-frequency magnetic field and detect an NMR signal generated in the sample. The first shield is provided in a sample-temperature region between the sample container and the detection coil, where the temperature of the sample-temperature region is equal to the temperature of the sample. The first shield is configured to block irradiation of the high-frequency magnetic field from the detection coil from reaching a region other than an observation object in the sample container. The second shield is provided in the low-temperature region between the detection coil and the first shield and configured to block irradiation of the high-frequency magnetic field from the detection coil from reaching the first shield.

According to the above-described features, irradiation of a high-frequency magnetic field to the portion or portions other than the observation object can be suppressed by the first shield. As a result, reduction in the resolution of the NMR spectrum can be suppressed. Also, since irradiation of the high-frequency magnetic field to the first shield provided in the sample-temperature region is suppressed by the second shield, it becomes possible to suppress decrease in the Q value of the detection coil due to the first shield being irradiated with the high-frequency magnetic field. As a result, high-frequency loss can be suppressed. For example, the detection coil and the second shield are provided in the cooled low-temperature region and the first shield is provided in a region whose temperature is higher than the temperature of the low-temperature region. The temperature of the first field provided in this region rises. When the first shield is irradiated with the high-frequency magnetic field, it is possible for the Q value of the detection coil to be decreased due to the temperature rise. According to the above-described features, since the irradiation of the high-frequency magnetic field to the first shield is suppressed, the decrease in the Q value of the detection coil can be suppressed.

The detection coil may have a first window section at a location corresponding to the observation object, irradiate the sample with the high-frequency magnetic field via the first window section, and detect the NMR signal generated in the sample. The first shield may have a second window section at a location corresponding to the first window section, the second window section having a size equal to or larger than a size of the first window section, and block irradiation of the high-frequency magnetic field from the detection coil from reaching the portion or portions other than the observation object by a portion other than the second window section. The second shield may have a third window section at a location corresponding to the first window section and block irradiation of the high-frequency magnetic field from the detection coil from reaching the first shield by a portion other than the third window section.

The width of the second window section may be 1.1 to 1.2 times the width of the first window section. By this configuration, as compared with a case where the width of the second window section is the same as the width of the first window section, the first shield is less likely to be irradiated with the high-frequency magnetic field generated in the detection coil, so that the decrease in the Q value of the detection coil can be more effectively suppressed.

The sample container may be provided in a pipe into which gas for adjustment of the temperature of the sample is supplied, and the first shield may be provided on the outer circumferential surface of the pipe.

The sample container may be provided in a pipe into which gas for adjustment of the temperature of the sample is supplied, and the first shield may be provided on the inner circumferential surface of the pipe.

According to the present disclosure, it becomes possible to suppress irradiation of a high-frequency magnetic field to the portion or portions other than the observation object in an NMR probe and suppress high-frequency loss.

BRIEF DESCRIPTION OF THE DRAWINGS

Embodiments of the present disclosure will be described by reference to the following figures, wherein:

FIG. 5 is a diagram illustrating a relationship between a window length and a Q value of a detection coil and resolution;

DESCRIPTION OF THE INVENTION

First Embodiment

Figure 4:
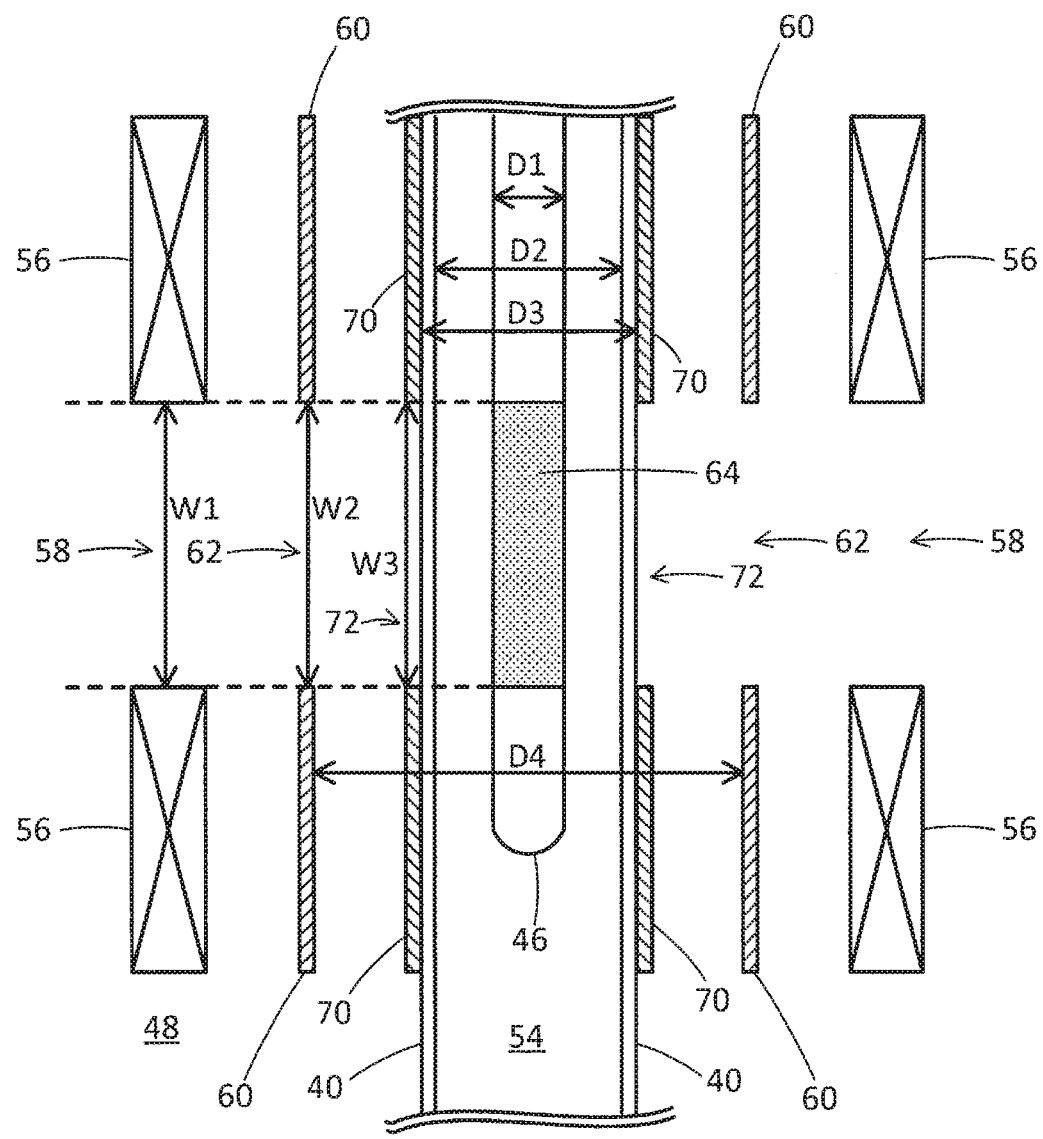
FIG. 4 is a sectional view illustrating an NMR probe according to a first embodiment.

A nuclear magnetic resonance (NMR) probe according to a first embodiment will be described hereinbelow with reference to FIG. 4. FIG. 4 is a sectional view illustrating the NMR probe according to the first embodiment.

Figure 1:
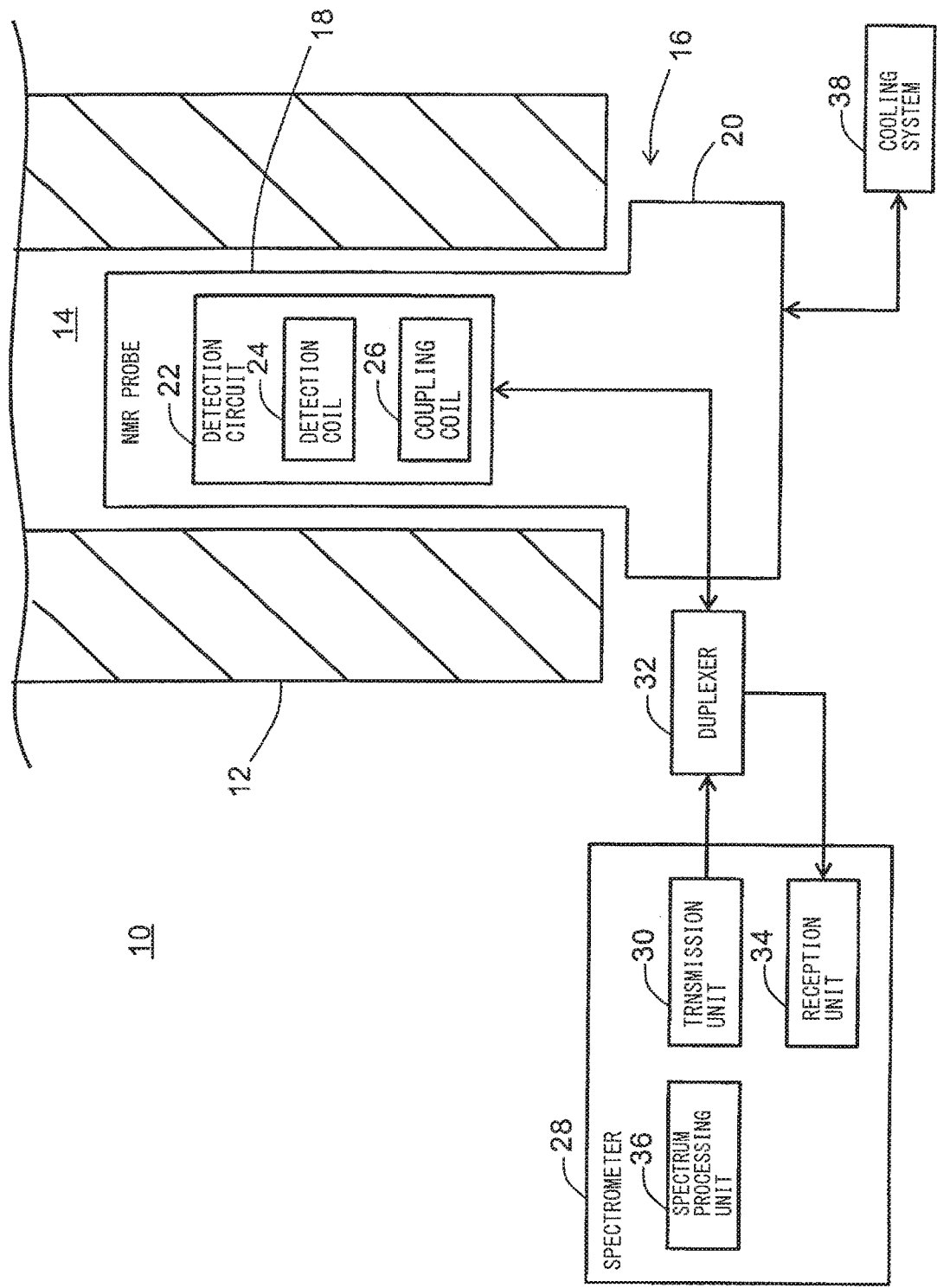
FIG. 1 is a block diagram illustrating an NMR device.
Figure 2:
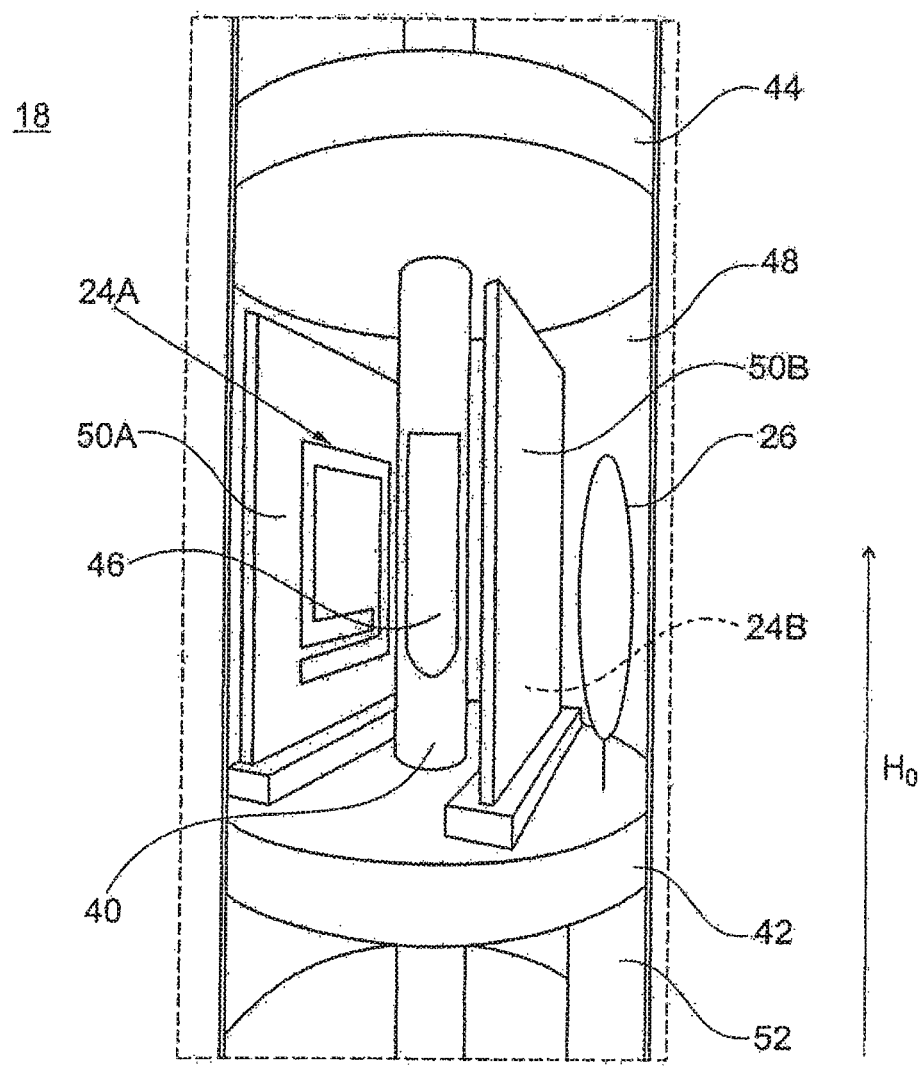
FIG. 2 is a perspective view illustrating a sample chamber and a detection coil.
Figure 3:
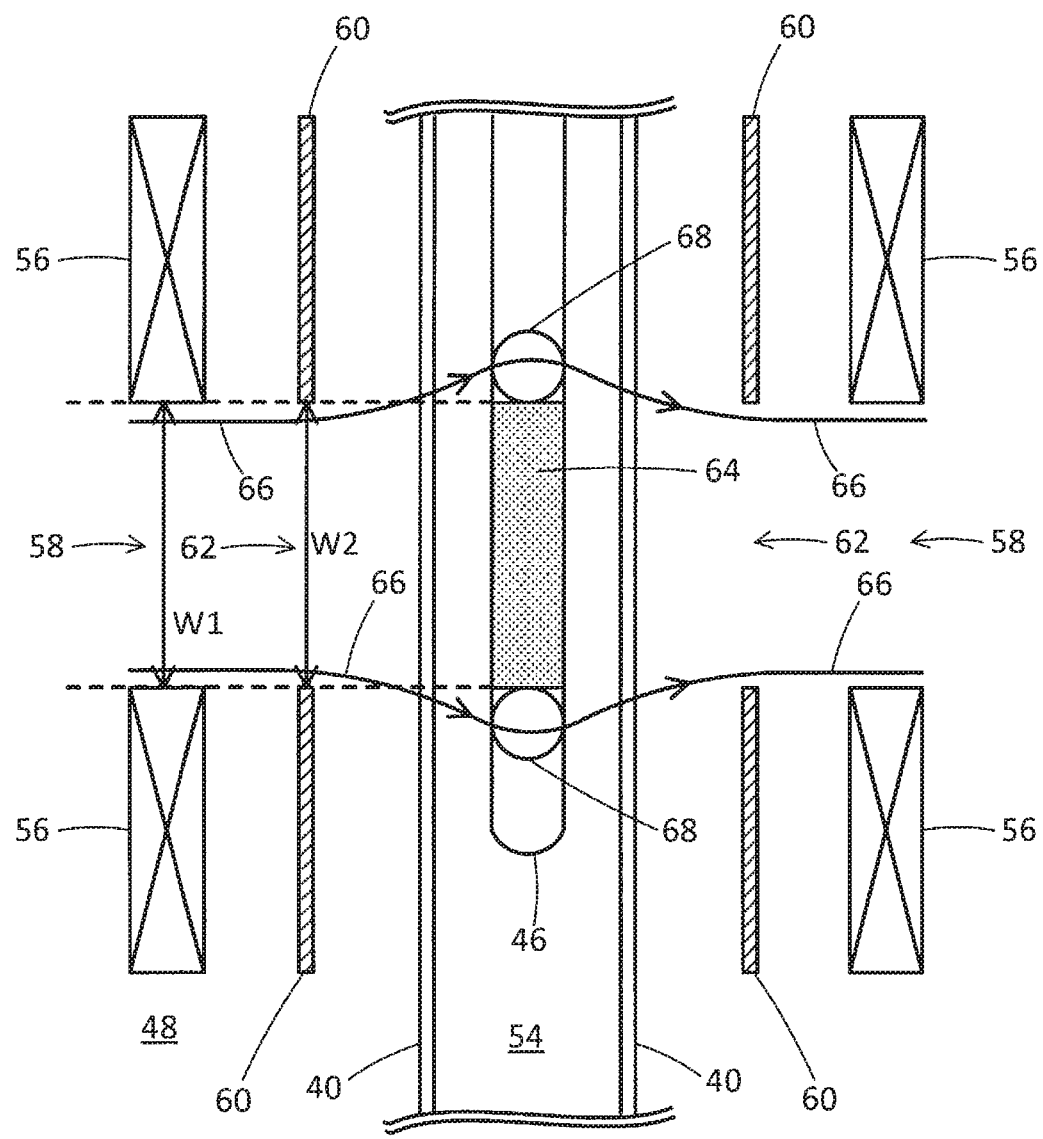
FIG. 3 is a sectional view illustrating an NMR probe according to a prior-art technique.

The NMR probe according to the first embodiment includes a sample temperature control pipe 40, a detection coil 56, and a low-temperature shield 60, which are similar to those of the NMR probe illustrated in FIG. 3.

The sample temperature control pipe 40 has a cylindrical shape. A sample pipe 46 is provided in the sample temperature control pipe 40. A space 54 in the sample temperature control pipe 40 is an atmospheric space and the temperature in the space 54 is controlled by temperature control gas supplied into the sample temperature control pipe 40. A sample is provided in the sample pipe 46. The sample may be solid or liquid.

An airtight chamber 48 whose pressure is reduced to a vacuum state is formed around the sample temperature control pipe 40. A detection coil 56 which as a whole has a cylindrical shape is provided in the airtight chamber 48. The detection coil 56 may be a saddle coil made of metal. The detection coil 56 is provided such that it surrounds the sample temperature control pipe 40 in a state where it is not in contact with the sample temperature control pipe 40. For example, the detection coil 56 is fixed to an outer circumferential surface of a cylindrical bobbin made of a dielectric material. The detection coil 56 retains its coil shape in this state. Also, two rectangular window sections 58 are formed and positioned in the detection coil 56 so as to face each other. A high-frequency magnetic field is created in a direction perpendicular to the window section 58. It should be noted that the window section 58 corresponds to an example of the "first window section."

Also, the low-temperature shield 60 which as a whole has a cylindrical shape is provided between the sample temperature control pipe 40 and the detection coil 56 in the airtight chamber 48. The low-temperature shield 60 is provided so as to surround the sample temperature control pipe 40 in a state where it is not in contact with the sample temperature control pipe 40. The low-temperature shield 60 serves as a shield against the high-frequency magnetic field. The low-temperature shield 60 includes a window section 62 formed at least at a location corresponding to the window section 58 of the detection coil 56. The low-temperature shield 60 may be a shield made of metal such as copper foil. The copper foil may contain aluminum. It should be noted that the low-temperature shield 60 may be constituted by two ring-shaped members provided away from each other on opposite sides of the window section 58. The low-temperature shield 60 corresponds to an example of the "second shield" and the window section 62 corresponds to an example of the "third window section."

Also, a room-temperature shield 70 is provided between the sample pipe 46 and the low-temperature shield 60. For example, the room-temperature shield 70 which as a whole has a cylindrical shape is provided on the outer circumferential surface of the sample temperature control pipe 40. Specifically, the room-temperature shield 70 is provided in a state where it is in contact with the outer circumferential surface of the sample temperature control pipe 40. The room-temperature shield 70 serves as a shield against the high-frequency magnetic field. The room-temperature shield 70 includes a window section 72 at least at a location corresponding to the window section 58 of the detection coil 56. A copper foil having thin platinum formed on its front and back may be used as the room-temperature shield 70. For example, platinum is formed on the front and back of the copper foil by sputtering. The room-temperature shield 70 is fixed by an adhesive or the like on the outer circumferential surface of the sample temperature control pipe 40, avoiding the location corresponding to the observation object 64. It should be noted that the room-temperature shield 70 may be constituted by two ring-shaped members provided apart from each other on opposite sides of the window section 72. The room-temperature shield 70 corresponds to an example of the "first shield" and the window section 72 corresponds to an example of the "second window section."

For example, the detection coil 56, the low-temperature shield 60, and the room-temperature shield 70 are provided such that the locations of the window sections 58, 62, 72 are aligned with each other. Here, the direction in which the sample temperature control pipe 40 and the sample pipe 46 extend (longitudinal direction) is defined as a vertical direction. For example, a width W2 (window length W2) in the vertical direction of the window section 62 of the low-temperature shield 60 agrees with a width W1 (window length W1) in the vertical direction of the window section 58 of the detection coil 56. Also, for example, a width W3 (window length W3) in the vertical direction of the window section 72 of the room-temperature shield 70 agrees with the width W1.

The detection coil 56 and the low-temperature shield 60 are provided in the airtight chamber 48 and cooled to a very low (or cryogenic) temperature (e.g., a temperature of 20K or less) by a heat exchanger which is not shown in FIG. 4. The temperature control gas is supplied into the sample temperature control pipe 40 and the temperature of the sample is controlled by the temperature control gas. For example, the temperature of the sample is maintained at room temperature. Also, since the room-temperature shield 70 is fixed to the outer circumferential surface of the sample temperature control pipe 40, the temperature of the room-temperature shield 70 is raised by the heat from the temperature control gas. For example, when the temperature of the temperature control gas is equal to the room temperature, the temperature of the room-temperature shield 70 will rise to about room temperature. In this manner, the temperature of the room-temperature shield 70 is controlled by the temperature control gas under the influence of the temperature control gas.

The high-frequency magnetic field generated by the detection coil 56 passes through the window section 62 of the low-temperature shield 60 and then passes through the window section 72 of the room-temperature shield 70, so that a predetermined range of the sample (observation object 64) is irradiated therewith. In this manner, the room-temperature shield 70 is configured to restrict the range of the sample to be irradiated with the high-frequency magnetic field such that only the observation object 64 of the sample is irradiated with the high-frequency magnetic field. Specifically, the room-temperature shield 70 is configured to shield the portion or portions other than the observation object 64 in the sample pipe 46 from being irradiated with the high-frequency magnetic field from the detection coil 56.

In order to implement the above-described function, the room-temperature shield 70 has a thickness that corresponds to the skin depth (skin thickness). Also, since the room-temperature shield 70 is provided near the sample, the magnetic susceptibility of the room-temperature shield 70 is preferably close to the magnetic susceptibility of the atmosphere of the room-temperature shield 70 in order to maintain the homogeneity of the static magnetic field in the observation object 64. In the example illustrated in FIG. 4, since the room-temperature shield 70 is provided in vacuum, the magnetic susceptibility of the room-temperature shield 70 is preferably close to the magnetic susceptibility of vacuum.

Also, the low-temperature shield 60 is configured to block irradiation of the high-frequency magnetic field from the detection coil 56 from reaching the room-temperature shield 70 and thereby suppress electrical interaction between the detection coil 56 and the room-temperature shield 70.

According to the first embodiment, irradiation of the high-frequency magnetic field to the portion or portions other than the observation object 64 can be suppressed by virtue of the room-temperature shield 70 provided on the outer circumferential surface of the sample temperature control pipe 40. Also, the low-temperature shield 60 provided between the detection coil 56 and the room-temperature shield 70 makes it possible to suppress reduction of the Q value of the detection coil 56, as a result of which loss in the high-frequency magnetic field can be suppressed. These aspects will be described in detail below.

The room-temperature shield 70 is provided on the outer circumferential surface of the sample temperature control pipe 40. In other words, the room-temperature shield 70 is provided at a location closer to the sample pipe 46 than is the low-temperature shield 60. As a result, it becomes possible to suppress the irradiation of the diffracted high-frequency magnetic field to the sample by virtue of the window section 62 of the low-temperature shield 60 as compared with a case where the room-temperature shield 70 is not provided and only the low-temperature shield 60 is provided. In other words, when the room-temperature shield 70 is not provided and the low-temperature shield 60 is provided at a location away from the sample temperature control pipe 40, as has been described with reference to FIG. 3, the sample is irradiated with the diffracted high-frequency magnetic field by the window section 62 of the low-temperature shield 60 with the spread corresponding to the distance between the low-temperature shield 60 and the sample pipe 46. In contrast, if the room-temperature shield 70 is provided on the outer circumferential surface of the sample temperature control pipe 40, the distance between the room-temperature shield 70 and the sample pipe 46 is shorter than the distance between the low-temperature shield 60 and the sample pipe 46. Even if the high-frequency magnetic field is diffracted by the window section 72 of the room-temperature shield 70, the degree of the spread of the diffracted high-frequency magnetic field is smaller than the degree of the spread of the diffracted high-frequency magnetic field that is diffracted by the low-temperature shield 60. Hence, the room-temperature shield 70 provided on the outer circumferential surface of the sample temperature control pipe 40 makes it possible to suppress the irradiation of the diffracted high-frequency magnetic field onto the sample as compared with a case where only the low-temperature shield 60 is provided and the room-temperature shield 70 is not provided. As a result, it becomes possible to suppress the irradiation of the high-frequency magnetic field to the portion or portions other than the observation object 64. Also, by virtue of the window section 62 of the low-temperature shield 60, the room-temperature shield 70 blocks the diffracted high-frequency magnetic field, which makes it possible to suppress the irradiation of the diffracted high-frequency magnetic field to the portion or portions other than the observation object 64 by virtue of the window section 62.

Also, the high-frequency magnetic field generated at the detection coil 56 passes through the window section 62 of the low-temperature shield 60 but is blocked from reaching the portion or portions other than the window section 62. As a result, the irradiation of the high-frequency magnetic field is less likely to reach the room-temperature shield 70. The temperature of the room-temperature shield 70 is raised by the heat from the temperature control gas, and the resistance of the room-temperature shield 70 is increased. When the room-temperature shield 70 in this state is irradiated with the high-frequency magnetic field, the contribution of absorption of the high-frequency magnetic field becomes larger than the contribution of reflection thereof, as a result of which the Q value of the detection coil 56 decreases and leads to loss of the high-frequency magnetic field. According to the first embodiment, since the irradiation of the high-frequency magnetic field to the room-temperature shield 70 is blocked by the low-temperature shield 60, the decrease in the Q value of the detection coil 56 can be suppressed, as a result of which the loss of the high-frequency magnetic field can be suppressed. In this manner, the low-temperature shield 60 is used to prevent the irradiation of the high-frequency magnetic field generated at the detection coil 56 from reaching the room-temperature shield 70. It should be noted that the low-temperature shield 60 is placed in the cryogenic (i.e., very low temperature) airtight chamber 48 and the low-temperature shield 60 is cryogenically cooled to a very low temperature. Hence, in the low-temperature shield 60, the contribution of the reflection of the high-frequency magnetic field becomes larger than that of the absorption thereof. As a result, even when the low-temperature shield 60 is irradiated with the high-frequency magnetic field, the Q value of the detection coil 56 is less likely to decrease as compared with a case where the room-temperature shield 70 is irradiated with the high-frequency magnetic field.

The sizes of the components are shown below. The sizes of the components are values normalized with the diameter of the sample pipe 46 regarded as 1.

The diameter D1 of the sample pipe 46: 1

The inner diameter D2 (diameter) of the sample temperature control pipe 40: 1.1 to 1.3

The outer diameter D3 (diameter) of the sample temperature control pipe 40: 1.3 to 1.4

The inner diameter D4 (diameter) of the low-temperature shield 60: 1.5 to 2.5

The window length W1 of the window section 58 of the detection coil 56: 2.5 to 4.5

Since the room-temperature shield 70 is provided on the outer circumferential surface of the sample temperature control pipe 40, the inner diameter (diameter) of the room-temperature shield 70 can be evaluated as being equal to the outer diameter D3 of the sample temperature control pipe 40. Also, as an example, the window length W2 of the window section 62 of the low-temperature shield 60 and the window length W3 of the window section 72 of the room-temperature shield 70 are identical with the window length W1.

In a case where the low-temperature shield 60 and the room-temperature shield 70 are provided away from each other and the window length W3 of the window section 72 of the room-temperature shield 70 is identical with the window length W1, the Q value of the detection coil 56 may be decreased due to the loss in the shielding current on the room-temperature shield 70. It should be noted that the window length W2 is regarded as being identical with the window length W1. For example, in a case where the room-temperature shield 70 is irradiated with the diffracted high-frequency magnetic field by the window section 62 of the low-temperature shield 60, the Q value of the detection coil 56 may be decreased due to the irradiation. In order to cope with this, the window length W3 of the window section 72 of the room-temperature shield 70 may be increased to be 1.1 to 1.2 time as large as the window length W1. When the window section 72 is widened, then the room-temperature shield 70 is not irradiated with the part of the diffracted high-frequency magnetic field corresponding to the widened portion of the window section 72 by virtue of the window section 62 of the low-temperature shield 60, and the part of the diffracted high-frequency magnetic field passes through the window section 72, so that the decrease in the Q value due to the irradiation can be suppressed. Meanwhile, the high-frequency magnetic field corresponding to the widened portion of the window section 72 passes through the window section 72 and cannot be blocked by the room-temperature shield 70, so that the portion or portions other than the observation object 64 are irradiated therewith, as a result of which the resolution of the NMR spectrum is reduced.

Specifically, if the window length W3 is identical with the window length W1, the diffracted high-frequency magnetic field which has been diffracted by the window section 62 of the low-temperature shield 60 is blocked by the room-temperature shield 70. As a result, the portion or portions other than the observation object 64 are not irradiated with the diffracted high-frequency magnetic field and the reduction in the resolution of the NMR spectrum is suppressed. However, the room-temperature shield 70 is irradiated with the diffracted high-frequency magnetic field, by the amount of which the Q value of the detection coil 56 is decreased. If the window length W3 is 1.1 to 1.2 times as large as the window length W1, then the room-temperature shield 70 is not irradiated with the high-frequency magnetic field corresponding to the widened portion of the window section 72 (the portion thereof corresponding to 0.1 to 0.2) out of the diffracted high-frequency magnetic field that has been diffracted by the window section 62 of the low-temperature shield 60, so that the decrease in the Q value of the detection coil 56 can be suppressed. However, the portion or portions other than the observation object 64 is nevertheless irradiated with the high-frequency magnetic field corresponding to the widened portion of the window section 72, by the amount of which the resolution is reduced. In other words, there is a trade-off between the Q value of the detection coil 56 and the resolution of the NMR spectrum depending upon the window lengths W1 and W3.

Figure 6:
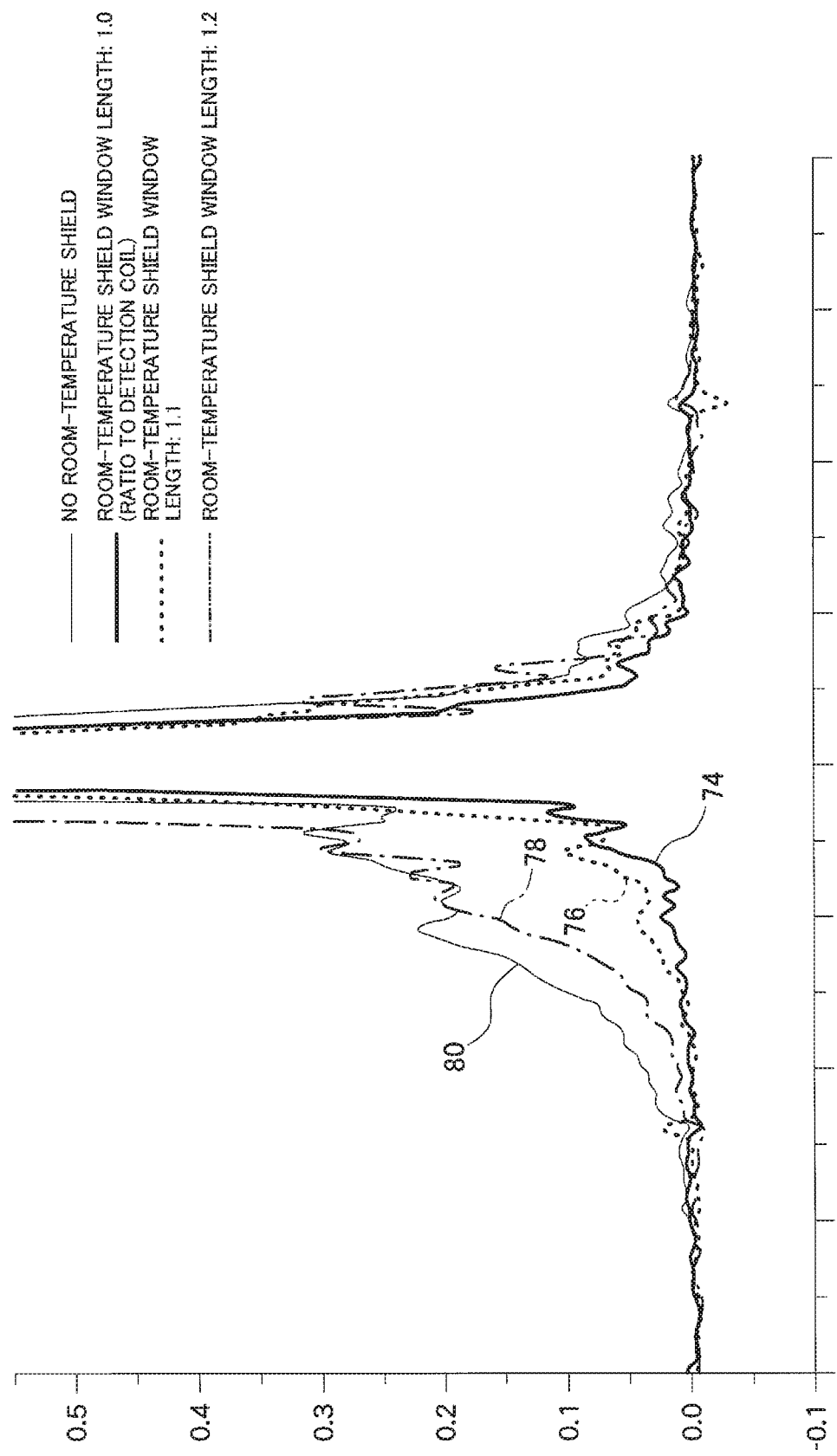
FIG. 6 is a diagram illustrating an NMR spectrum.

The relationship between the window lengths W1, W3 and the Q value of the detection coil 56 and resolution will be described below with reference to FIGS. 5 and 6. FIGS. 5 and 6 illustrate the results of simulation of the NMR spectrum. The simulation results have been obtained using the NMR probe according to the first embodiment. Here, the window length W3 was modified in a stepwise manner and the NMR spectrum was obtained. These results will be explained in detail below.

FIG. 5 illustrates the relationship between the window length W3 of the window section 72 of the room-temperature shield 70, the Q value of the detection coil 56, and the line shape of the NMR spectrum. The window length W3 is a value normalized by the window length W1 of the window section 58 of the detection coil 56. The line shape is an indicator for evaluating the resolution of the NMR spectrum. The height of the main peak of the NMR spectrum is defined as 100% and the width of the NMR spectrum at each height is indicated as the value for the line shape. For example, the width of the NMR spectrum at the height of 0.55% and the value for the NMR spectrum at the height of 0.11% are indicated.

The low-temperature shield 60 and the room-temperature shield 70 are used in Examples 1 to 3. In the comparative example, the low-temperature shield 60 is used but the room-temperature shield 70 is not used. In Example 1, the window length W3 is 1.0 times as large as the window length W1. In Example 2, the window length W3 is 1.1 times as large as the window length W1. In Example 3, the window length W3 is 1.2 times as large as the window length W1.

FIG. 6 illustrates an NMR spectrum. The horizontal axis represents the frequency and the vertical axis represents the intensity of the spectrum. The values are normalized. A spectrum 74 is an NMR spectrum according to Example 1. A spectrum 76 is an NMR spectrum according to Example 2. A spectrum 78 is an NMR spectrum according to Example 3. A spectrum 80 is an NMR spectrum according to the comparative example.

As illustrated in FIG. 5, if the window length W3 is 1.1 to 1.2 times as large as the window length W1, the Q value of the detection coil 56 is increased and the width of the line shape is increased (the resolution of the NMR spectrum is decreased) as compared with a case where the window length W3 is the same as the window length W1 (1.0 times as large as the latter). In other words, the Q value of the detection coil 56 can be increased by widening the window length W3 to be wider than the window length W1, but the resolution of the NMR spectrum is reduced. Meanwhile, the resolution of the NMR spectrum can be improved by making the window length W3 identical with the window length W1, but the Q value of the detection coil 56 is decreased.

When the room-temperature shield 70 is not used (comparative example), the Q value of the detection coil 56 is not decreased but the width of the line shape becomes larger than that in the case where the room-temperature shield 70 is used (Example 1 to 3). That is, the resolution of the NMR spectrum is reduced.

As has been discussed above, the Q value of the detection coil 56 and the resolution of the NMR spectrum change depending on the magnitude relationship between the window length W1 and the window length W3. In Examples 1 to 3, the Q value may be decreased depending on the width of the window length W3. However, even in that case, the resolution of the NMR spectrum can be improved as compared with the comparative example. Also, by adjusting the width of the window length W3, the resolution of the NMR spectrum can be improved as compared with the comparative example while the decrease in the Q value can be suppressed. In this manner, use of the room-temperature shield 70 makes it possible to suppress decrease in the Q value of the detection coil 56 while suppressing reduction in the resolution of the NMR spectrum as compared with a case where the room-temperature shield 70 is not used.

Second Embodiment

Figure 7:
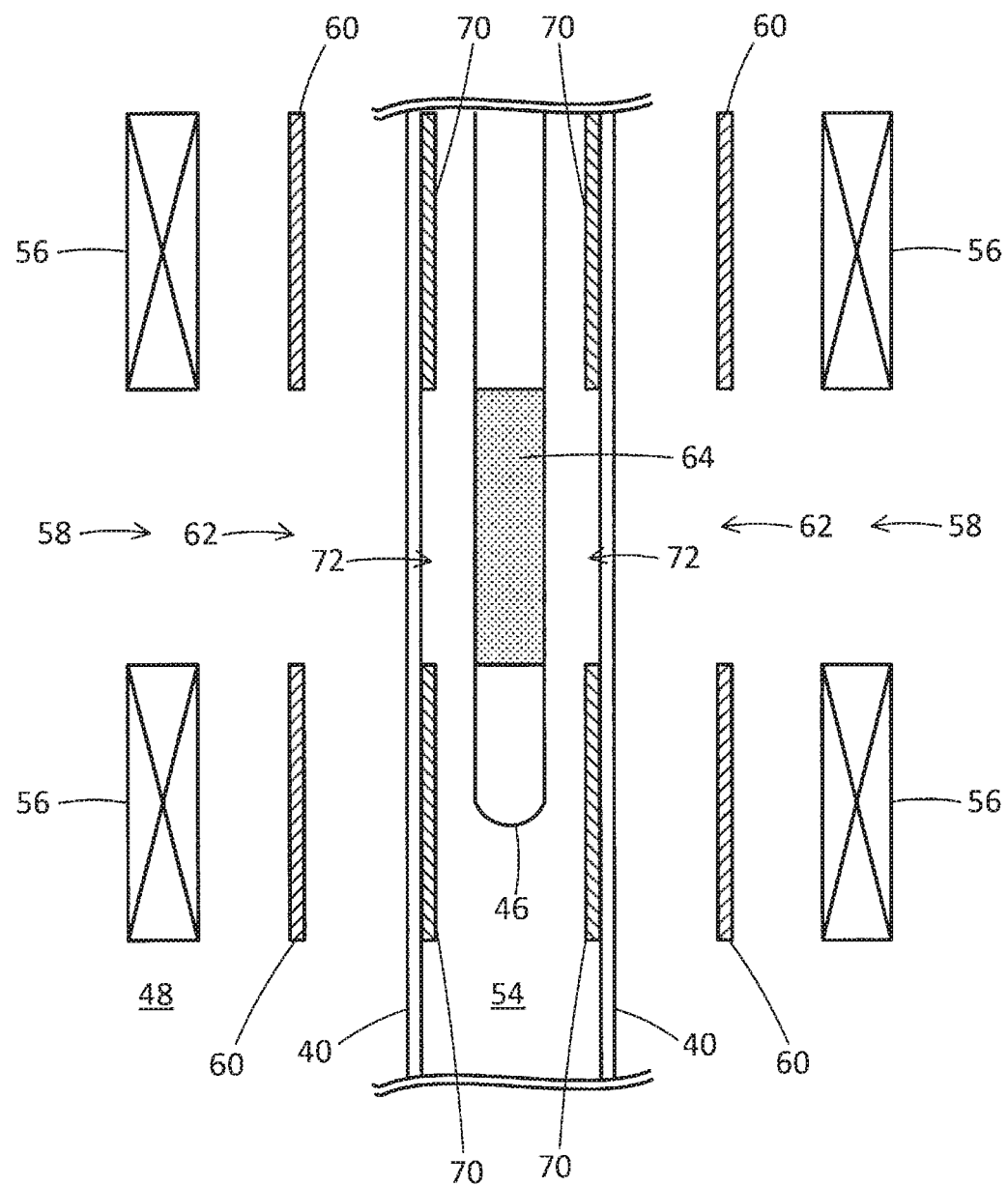
FIG. 7 is a sectional view illustrating an NMR probe according to a second embodiment.

An NMR probe according to a second embodiment will be described below with reference to FIG. 7. FIG. 7 is a sectional view illustrating the NMR probe according to the second embodiment.

The NMR probe according to the second embodiment includes the room-temperature shield 70 in the same manner as in the NMR probe according to the first embodiment. While the room-temperature shield 70 in the first embodiment is provided on the outer circumferential surface of the sample temperature control pipe 40, the room-temperature shield 70 according to the second embodiment is provided on the inner surface of the sample temperature control pipe 40; i.e., on the inner circumferential surface. In the second embodiment as well, the room-temperature shield 70 has the window section 72. Features other than the room-temperature shield 70 are the same as the features according to the first embodiment.

In the same manner as in the first embodiment, a copper foil having thin platinum formed on its front and back may be used as the room-temperature shield 70. The room-temperature shield 70 is fixed by an adhesive or the like on the inner circumferential surface of the sample temperature control pipe 40, avoiding the location corresponding to the observation object 64.

According to the second embodiment, since the room-temperature shield 70 is provided in the sample temperature control pipe 40, the magnetic susceptibility of the room-temperature shield 70 is preferably close to the magnetic susceptibility of the temperature control gas (e.g., magnetic susceptibility of dry air).

According to the second embodiment, in the same manner as in the first embodiment, irradiation of the high-frequency magnetic field to the portion or portions other than the observation object 64 can be suppressed. In addition, decrease in the Q value of the detection coil 56 can be suppressed.

Third Embodiment

Figure 8:
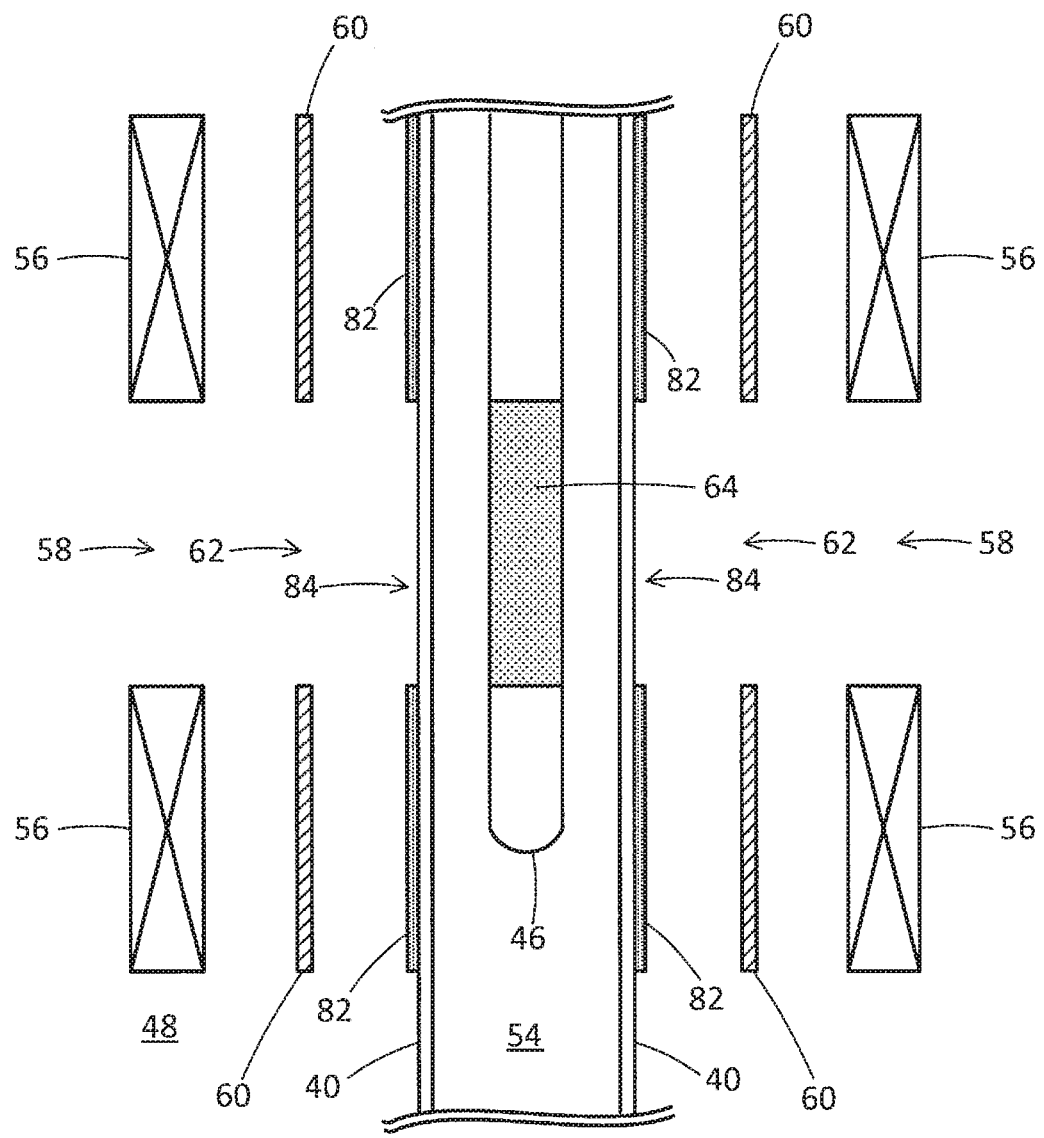
FIG. 8 is a sectional view illustrating an NMR probe according to a third embodiment.

An NMR probe according to the third embodiment will be described below with reference to FIG. 8. FIG. 8 is a sectional view illustrating the NMR probe according to the third embodiment.

The NMR probe according to the third embodiment includes a room-temperature shield 82. The room-temperature shield 82 is provided on the outer circumferential surface of the sample temperature control pipe 40 in the same manner as in the NMR probe according to the first embodiment. In the third embodiment as well, the room-temperature shield 82 has a window section 84. The location where the room-temperature shield 82 is provided is identical with the location where the room-temperature shield 70 according to the first embodiment is provided. Also, the location where the window section 84 is formed is identical with the location where the window section 72 according to the first embodiment is formed. Features other than the room-temperature shield 82 are the same as the features according to the first embodiment.

The thickness of the room-temperature shield 82 is smaller than that of the room-temperature shield 70. The room-temperature shield 82 made of silver is formed, for example, by coating silver on the outer circumferential surface of the sample temperature control pipe 40 using silver nanoparticles. As another example, the room-temperature shield 82 made of gold may be formed by depositing gold on the outer circumferential surface of the sample temperature control pipe 40 by gold deposition. The room-temperature shield 82 has a thickness that corresponds to the skin depth (skin thickness) in the same manner as in the room-temperature shield 70. Since the room-temperature shield 82 is thin, the homogeneity of the static magnetic field generated in the observation object 64 can be maintained by normal shimming operation.

According to the third embodiment, in the same manner as in the first embodiment, it becomes possible to suppress irradiation of the high-frequency magnetic field to the portion or portions other than the observation object 64. In addition, decrease in the Q value of the detection coil 56 can be suppressed.

Fourth Embodiment

Figure 9:
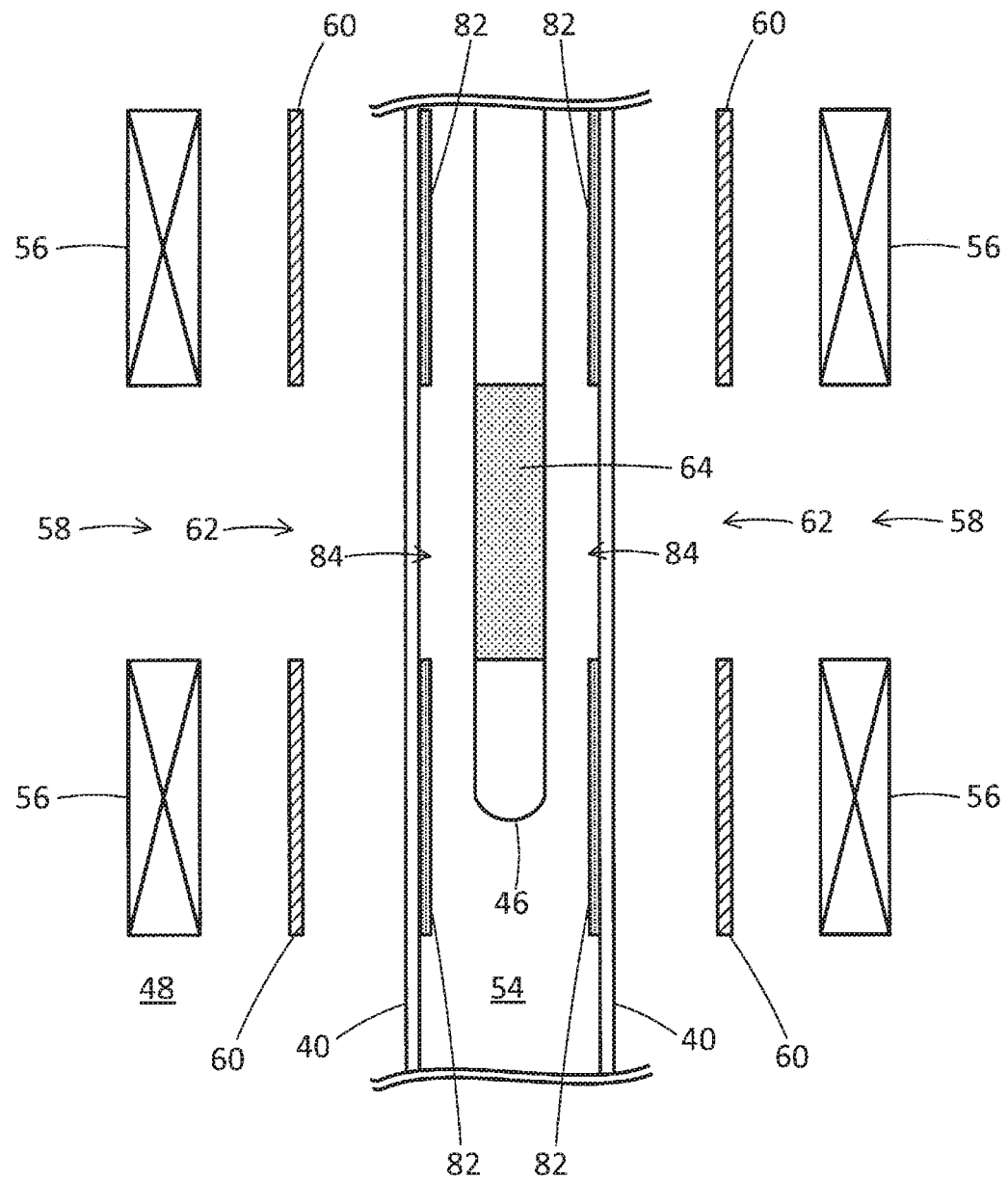
FIG. 9 is a sectional view illustrating an NMR probe according to a fourth embodiment.

An NMR probe according to the fourth embodiment will be described below with reference to FIG. 9. FIG. 9 is a sectional view illustrating the NMR probe according to the fourth embodiment.

The NMR probe according to the fourth embodiment includes the room-temperature shield 82 in the same manner as in the NMR probe according to the third embodiment. According to the fourth embodiment, in the same manner as in the second embodiment, the room-temperature shield 82 is provided on the inner circumferential surface of the sample temperature control pipe 40. In the fourth embodiment as well, the room-temperature shield 82 has the window section 84. Features other than the location of the room-temperature shield 82 are the same as the features according to the third embodiment.

In the same manner as in the third embodiment, the room-temperature shield 82 made of silver is formed, for example, by coating silver on the inner circumferential surface of the sample temperature control pipe 40 using nanoparticles. Since the room-temperature shield 82 is thin, the homogeneity of the static magnetic field generated in the observation object 64 can be maintained by normal shimming operation.

According to the fourth embodiment, in the same manner as in the first embodiment, irradiation of the high-frequency magnetic field to the portion or portions other than the observation object 64 can be suppressed. In addition, decrease in the Q value of the detection coil 56 can be suppressed.

The above-described room-temperature shields 70, 82 can be readily mounted to a conventional NMR probe. For example, the room-temperature shield 70 and the room-temperature shield 82 can be readily provided at the inner portion of the coil bobbin to which the detection coil is fixed. For example, in the case of the NMR probe depicted in FIG. 3b of U.S. Pat. No. 5,247,256, a coil is attached to the outer surface of a cylindrical member made of a material having high thermal conductivity (e.g., sapphire). In this case, the room-temperature shield 70 or the room-temperature shield 82 can be provided inside the cylindrical member. For example, a metal foil whose magnetic susceptibility has been corrected may be attached to the inner surface of the cylindrical member or silver may be coated on the same inner surface.

Also, the coil depicted in FIG. 3c of U.S. Pat. No. 5,247,256 is placed in thermal contact with the cooling member. In this case, a cylindrical member that is a good thermal conductor and electrical insulator may be provided inside the coil, and the room-temperature shield 70 or the room-temperature shield 82 may be provided inside the cylindrical member. In addition to and separately from the coil, a cylindrical member that is a good thermal conductor and electrical insulator may be provided, the room-temperature shield 70 or the room-temperature shield 82 may be provided inside the cylindrical member, and then the cylindrical member may be brought into thermal contact with the cooling member.

The invention claimed is:

1. A nuclear magnetic resonance (NMR) probe inserted into an NMR device and detecting an NMR signal from a sample, the NMR probe comprising:
   a detection coil provided in a low-temperature region so as to surround a sample container accommodating the sample and configured to irradiate the sample with a high-frequency magnetic field and detect an NMR signal generated in the sample, wherein a temperature of the low-temperature region is lower than a temperature of the sample;
   a first shield provided in a sample-temperature region between the sample container and the detection coil and configured to block irradiation of the high-frequency magnetic field from the detection coil from reaching a region other than an observation object in the sample container, wherein a temperature of the sample-temperature region is equal to the temperature of the sample; and
   a second shield provided in the low-temperature region between the detection coil and the first shield and configured to block irradiation of the high-frequency magnetic field from the detection coil from reaching the first shield.

2. The NMR probe according to claim 1, wherein
   the detection coil has a first window section at a location corresponding to the observation object, irradiates the sample with the high-frequency magnetic field via the first window section, and detects the NMR signal generated in the sample;
   the first shield has a second window section at a location corresponding to the first window section, the second window section having a size equal to or larger than a size of the first window section, and blocks, by a portion other than the second window section, irradiation of the high-frequency magnetic field from the detection coil from reaching the portion other than the observation object; and
   the second shield has a third window section at a location corresponding to the first window section and blocks, by a portion other than the third window section, irradiation of the high-frequency magnetic field from the detection coil from reaching the first shield.

3. The NMR probe according to claim 2, wherein a width of the second window section is 1.1 to 1.2 times a width of the first window section.

4. The NMR probe according to claim 1, wherein the sample container is provided in a pipe into which gas for adjustment of a temperature of the sample is supplied, and the first shield is provided on an outer circumferential surface of the pipe.

5. The NMR probe according to claim 1, wherein the sample container is provided in a pipe into which gas for adjustment of a temperature of the sample is supplied, and the first shield is provided on an inner circumferential surface of the pipe.

* * * * *